(12) United States Patent
Huang et al.

(10) Patent No.: US 11,158,648 B2
(45) Date of Patent: Oct. 26, 2021

(54) DOUBLE CHANNEL MEMORY DEVICE

(71) Applicant: TAIWAN SEMICONDUCTOR MANUFACTURING CO., LTD., Hsinchu (TW)

(72) Inventors: Hung-Shu Huang, Taichung (TW); Ming-Chyi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/354,001

(22) Filed: Mar. 14, 2019

(65) Prior Publication Data
US 2020/0295015 A1     Sep. 17, 2020

(51) Int. Cl.
| | |
|---|---|
| H01L 29/792 | (2006.01) |
| H01L 27/1157 | (2017.01) |
| H01L 21/311 | (2006.01) |
| H01L 21/033 | (2006.01) |
| H01L 29/423 | (2006.01) |
| H01L 29/66 | (2006.01) |
| H01L 29/78 | (2006.01) |
| H01L 21/28 | (2006.01) |

(52) U.S. Cl.
CPC ...... *H01L 27/1157* (2013.01); *H01L 21/0337* (2013.01); *H01L 21/31144* (2013.01); *H01L 29/40117* (2019.08); *H01L 29/42344* (2013.01); *H01L 29/66795* (2013.01); *H01L 29/66833* (2013.01); *H01L 29/7851* (2013.01); *H01L 29/792* (2013.01)

(58) Field of Classification Search
CPC ............ H01L 29/792; H01L 29/66833; H01L 27/1157; H01L 29/42344; H01L 29/66795
See application file for complete search history.

(56) References Cited

U.S. PATENT DOCUMENTS

| | | | |
|---|---|---|---|
| 2006/0044873 A1* | 3/2006 | Katayama | H01L 27/115 365/185.18 |
| 2014/0008716 A1* | 1/2014 | Arigane | H01L 29/66833 257/326 |
| 2017/0200726 A1* | 7/2017 | Tsuda | H01L 29/42344 |
| 2018/0012901 A1* | 1/2018 | Tsuda | H01L 21/762 |
| 2018/0090626 A1* | 3/2018 | Yamashita | H01L 29/66795 |
| 2018/0097007 A1* | 4/2018 | Tsukuda | H01L 27/1157 |
| 2018/0097008 A1* | 4/2018 | Hayashi | H01L 21/823431 |
| 2018/0182774 A1* | 6/2018 | Narumi | H01L 27/11568 |

(Continued)

*Primary Examiner* — Michele Fan
(74) *Attorney, Agent, or Firm* — Maschoff Brennan

(57) ABSTRACT

A semiconductor device includes a substrate, a fin structure, an insulating layer, a select gate, a memory gate, and a charge trapping layer. The fin structure includes a first portion and a second extend from the substrate. Each of the first portion and the second portion includes a first sidewall and a second sidewall, and the second sidewalls are between the first sidewalls. The insulating layer is disposed between the second sidewalls of the first and second portions. The select gate and the memory gate extend across the fin structure and the insulating layer. The charge trapping layer is disposed between the memory gate and the select gate, between the memory gate and the insulating layer, and between the memory gate and the fin structure, and the second sidewalls of the first and second portions are free from in contact with the charge trapping layer.

13 Claims, 23 Drawing Sheets

(56) References Cited

U.S. PATENT DOCUMENTS

| | | | |
|---|---|---|---|
| 2018/0286875 A1* | 10/2018 | Okada | H01L 21/823821 |
| 2018/0337281 A1* | 11/2018 | Mihara | H01L 29/4234 |
| 2018/0342526 A1* | 11/2018 | Tsuda | H01L 29/7851 |
| 2018/0374924 A1* | 12/2018 | Yoshitomi | H01L 29/66833 |
| 2019/0198681 A1* | 6/2019 | Hayashi | H01L 27/1157 |
| 2019/0348428 A1* | 11/2019 | Tsuda | H01L 21/823431 |
| 2019/0378851 A1* | 12/2019 | Takizawa | G11C 16/3495 |
| 2020/0006526 A1* | 1/2020 | Hisamoto | H01L 29/66545 |
| 2020/0035693 A1* | 1/2020 | Hisamoto | H01L 27/11539 |
| 2020/0152652 A1* | 5/2020 | Hayashi | H01L 29/4236 |
| 2020/0279856 A1* | 9/2020 | Yamaguchi | H01L 27/11573 |

\* cited by examiner

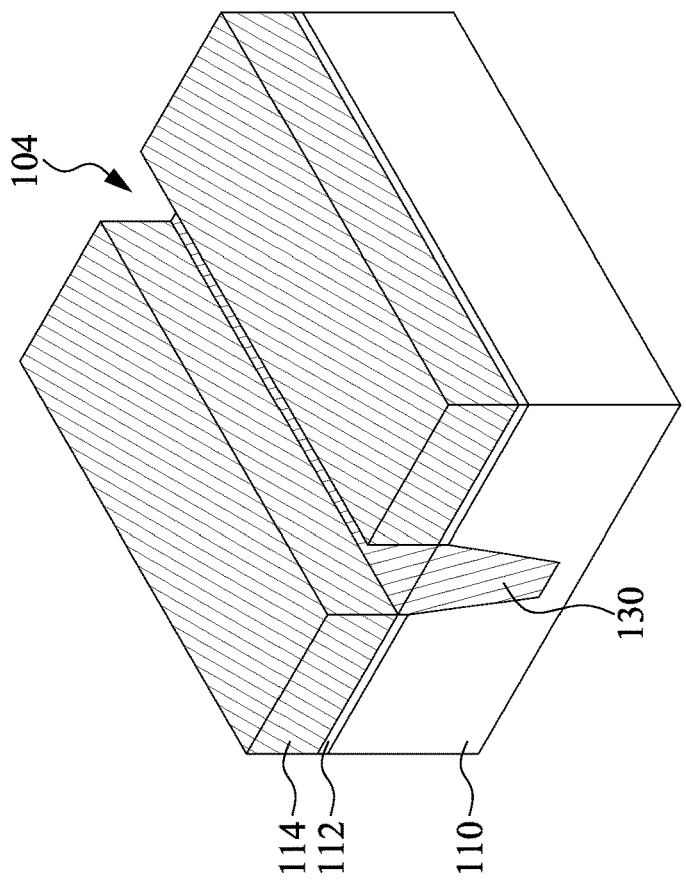
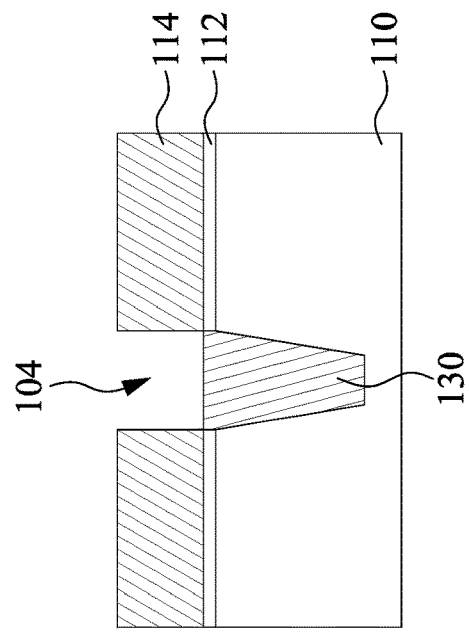
Fig. 4A
Fig. 4B

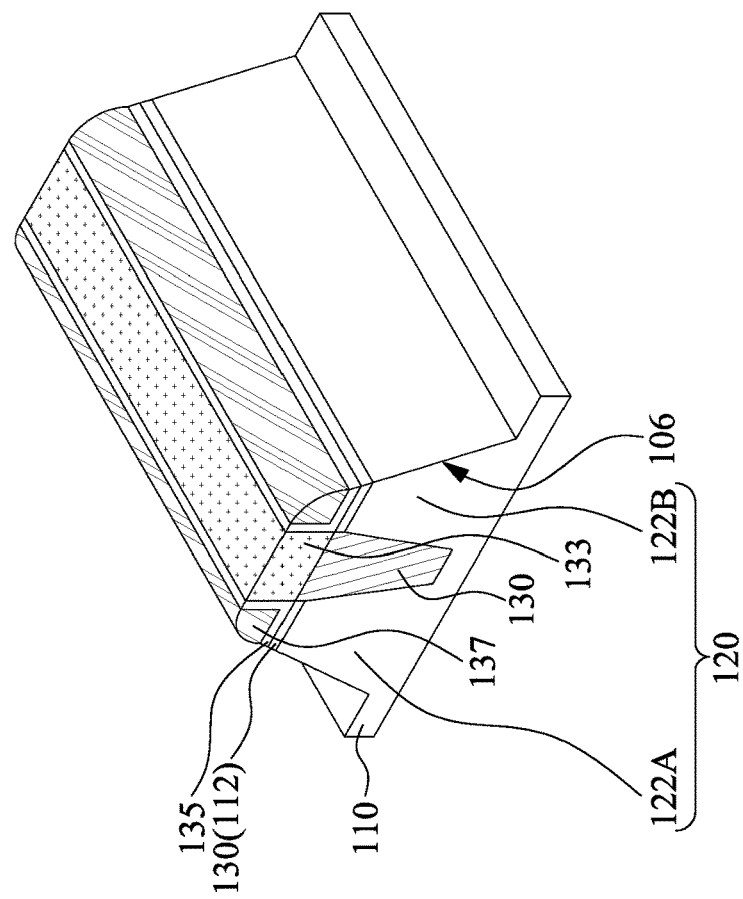
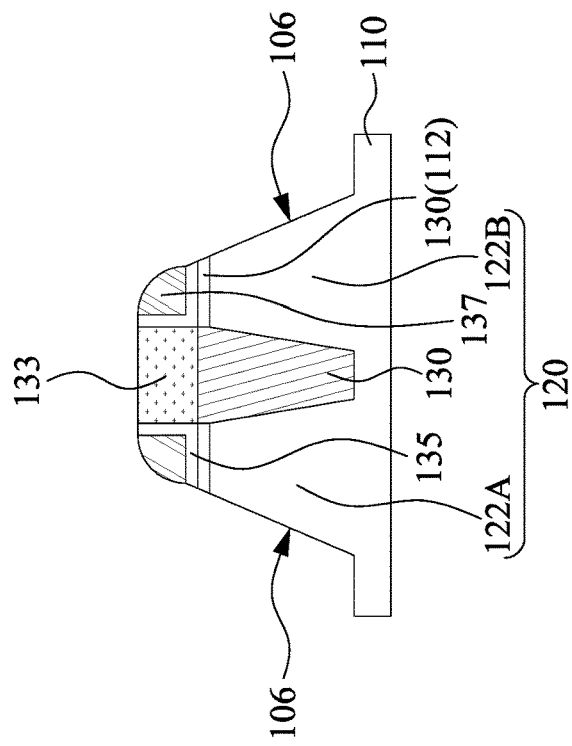
Fig. 9A
Fig. 9B

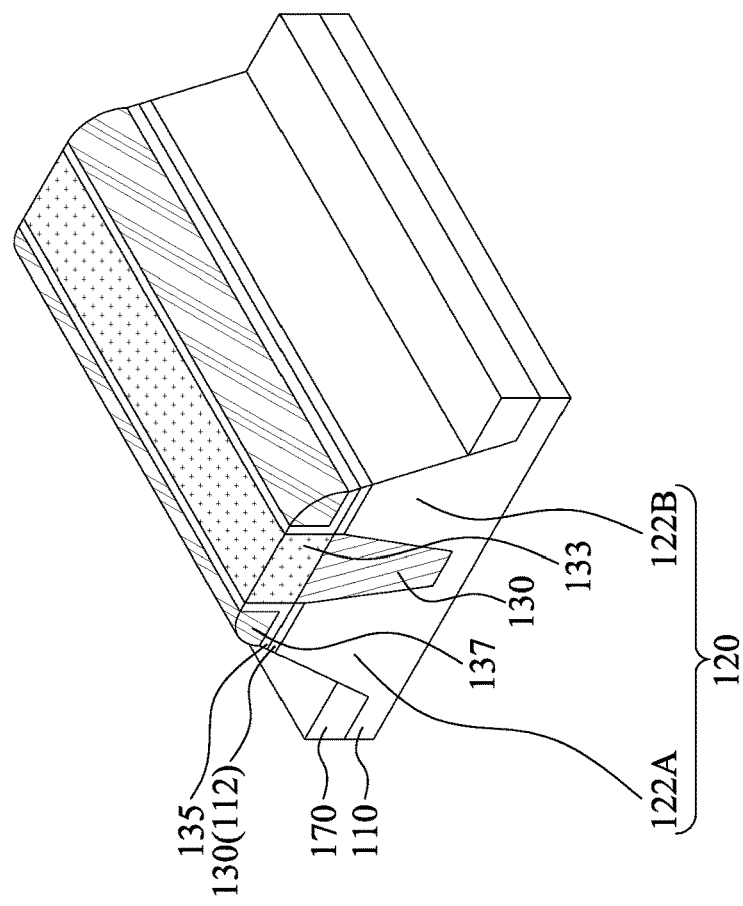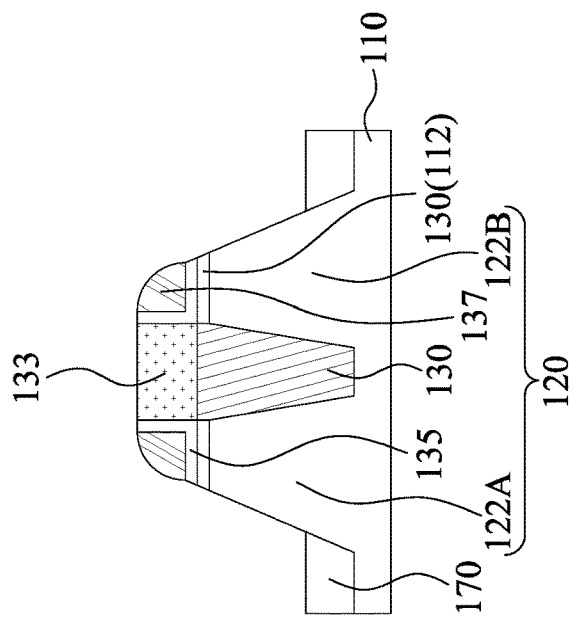
Fig. 10A
Fig. 10B

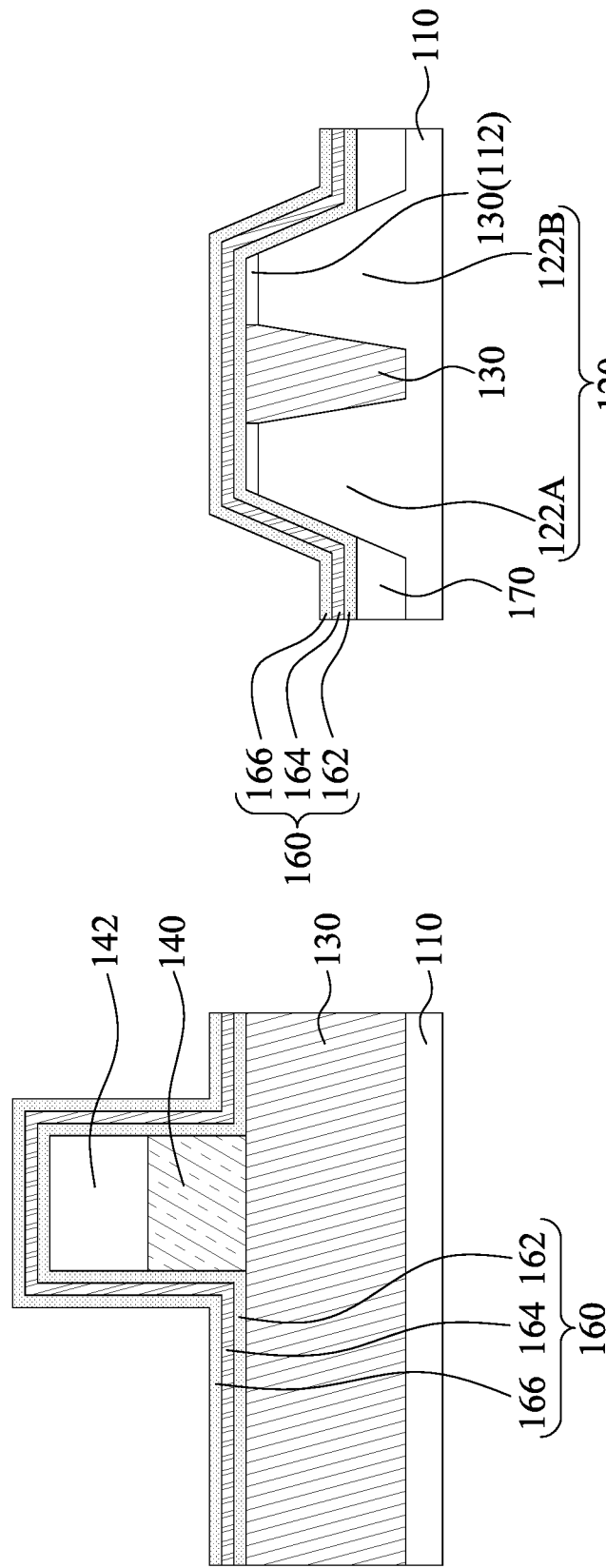

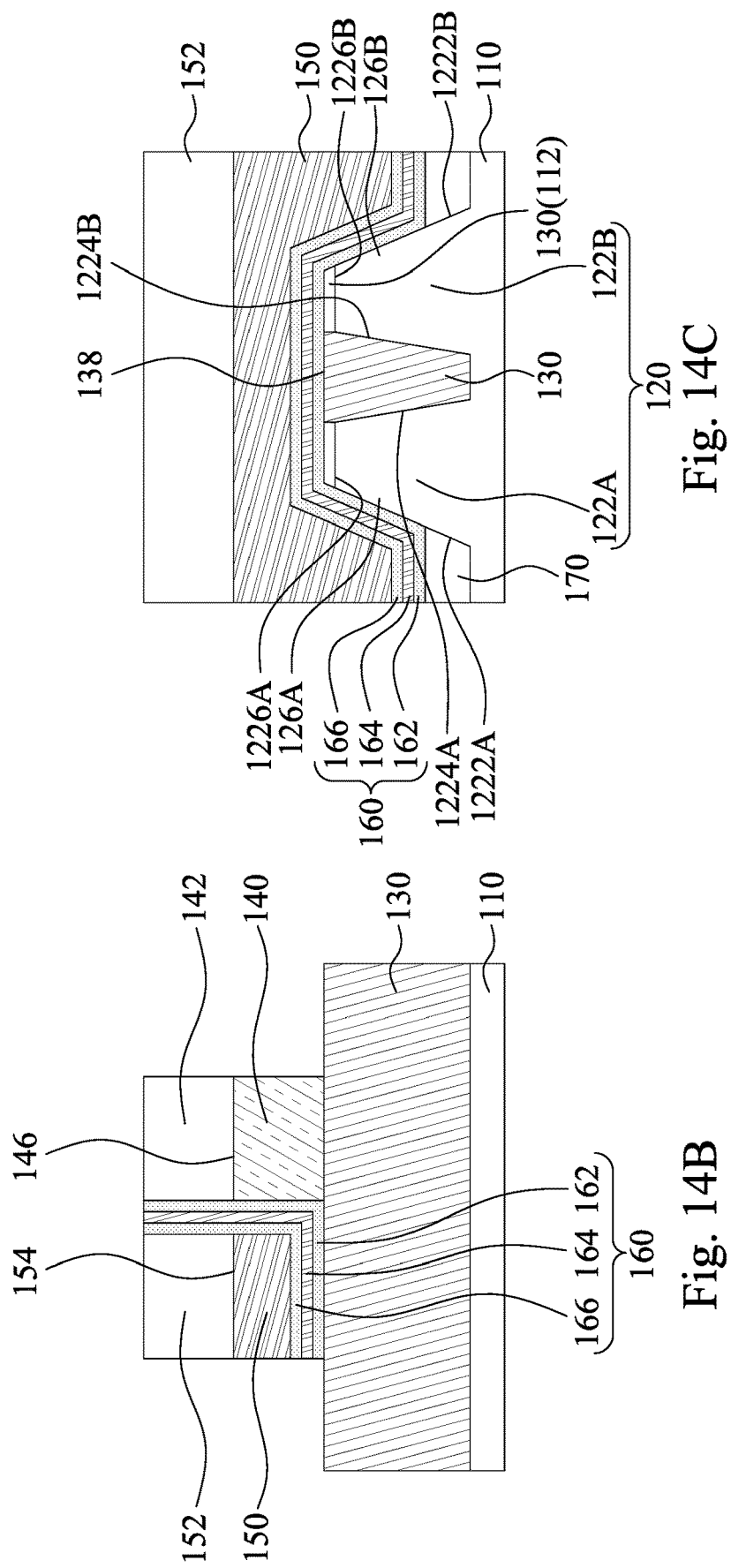

DOUBLE CHANNEL MEMORY DEVICE

BACKGROUND

A metal-oxide-nitride-oxide-semiconductor (MONOS) memory cell is a type of nonvolatile memory device structure. A MONOS cell generally comprises a semiconductor substrate, a channel layer above the semiconductor substrate, source and drain diffusion regions in the Surface of the semiconductor Substrate, and a gate conductor above the channel layer. An oxide-nitride-oxide (ONO) layer is disposed between the channel layer and the gate conductor. In the ONO layer, a layer of nitride is sandwiched between two insulating layers of oxide. In a MONOS memory cell, electric charge is stored in traps in the nitride layer, and this stored charge is utilized to store data. MONOS memory devices provide high stability and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, 11A are perspective views of a memory device at different intermediate fabrication stage of the method of FIGS. 1A and 1B according to some embodiments of the present disclosure.

FIGS. 2B, 3B, 4B, 5B, 6B, 7B, 8B, 9B, 10B, 11B are front views of the memory device in FIGS. 2A, 3A, 4A, 5A, 6A, 7A, 8A, 9A, 10A, 11A, respectively.

FIGS. 12B, 12C, 13B, 13C, 14B, 14C, 14D, 16B, 16C, and 16D are cross sectional views of the memory device taken along the line 12B-12B, line 12C-12C, line 13B-13B, line 13C-13C, line 14B-14B, line 14C-14C, line 14D-14D, line 16B-16B, line 16C-16C, and line 16D-16D in FIGS. 12A, 13A, 14A, and 16A according to some embodiments of the present disclosure.

DETAILED DESCRIPTION

Figure 1A:
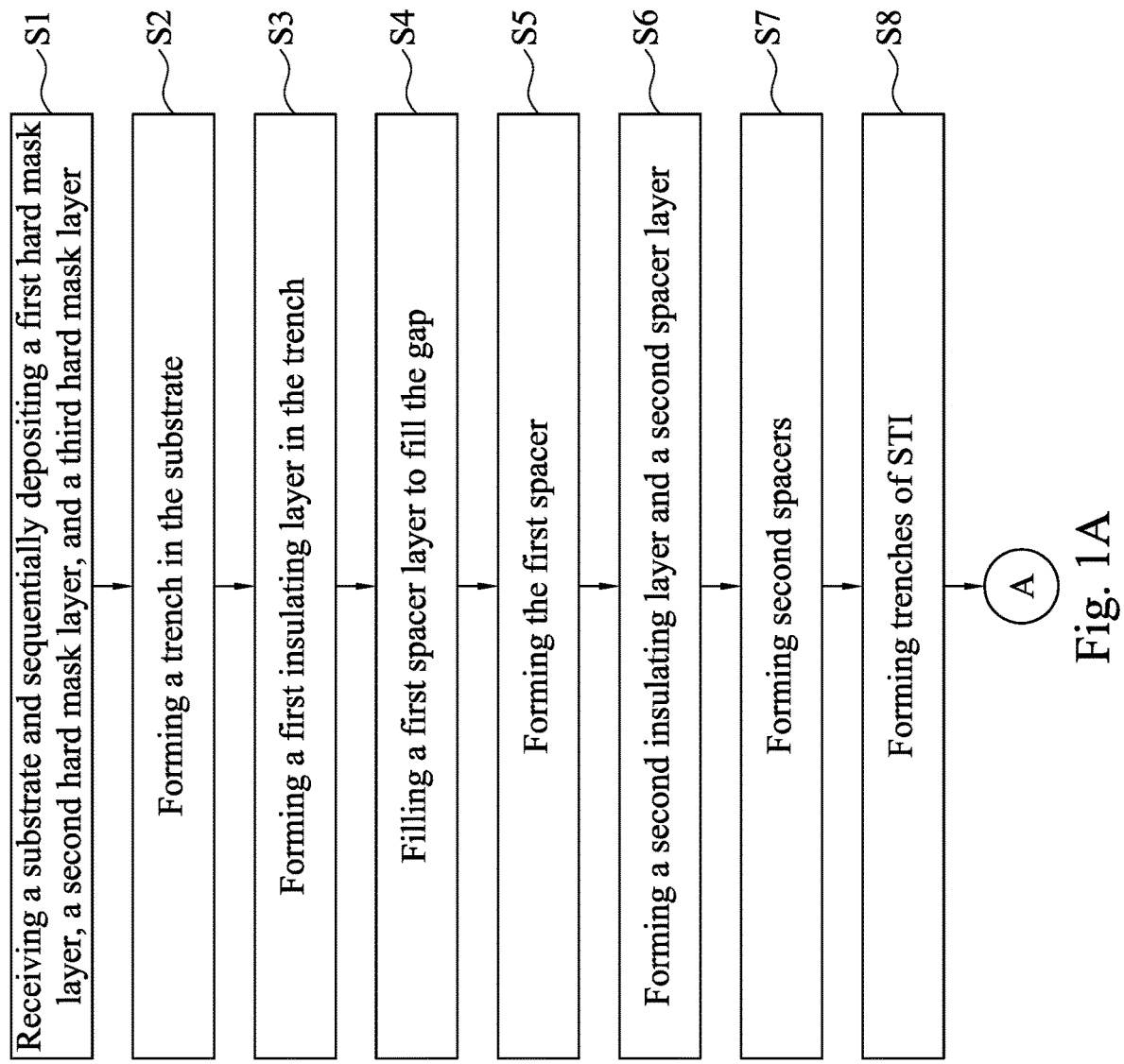
FIGS. 1A and 1B are flow charts of a method of fabricating a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
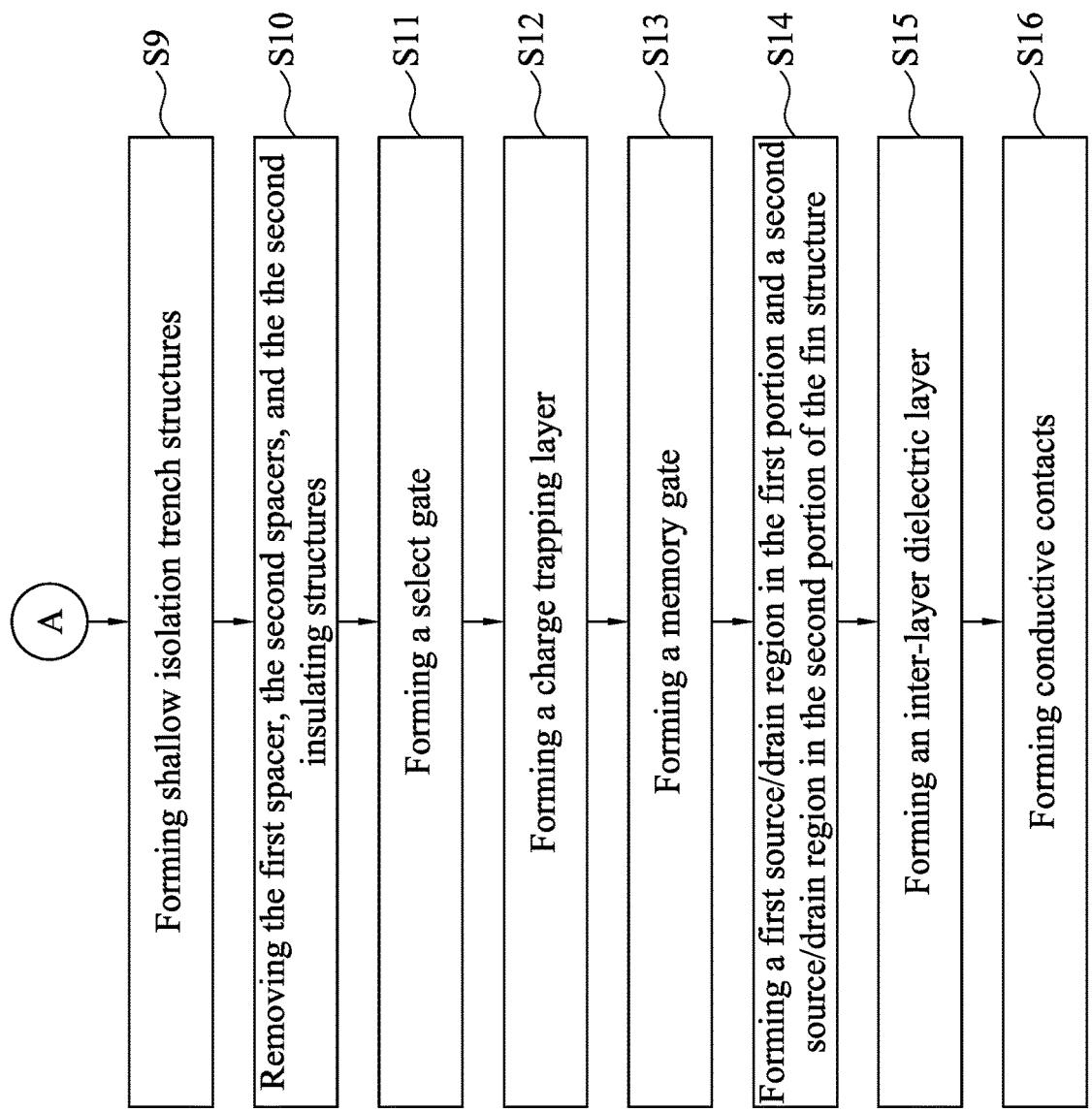

FIGS. 1A and 1B are flow charts of a method of fabricating a memory device according to some embodiments of the present disclosure. FIGS. 2A, 3A, 4A, 5A, 6A, 7A, 8A, 9A, 10A, 11A are perspective views of a memory device 100 at different intermediate fabrication stage of the method of FIGS. 1A and 1B according to some embodiments of the present disclosure. FIGS. 2B, 3B, 4B, 5B, 6B, 7B, 8B, 9B, 10B, 11B are front views of the memory device 100 in FIGS. 2A, 3A, 4A, 5A, 6A, 7A, 8A, 9A, 10A, 11A, respectively. It is understood that additional steps can be provided before, during, and/or after the method, and some of the steps described can be replaced, eliminated, and/or moved around for additional embodiments of the method.

Figure 2B:
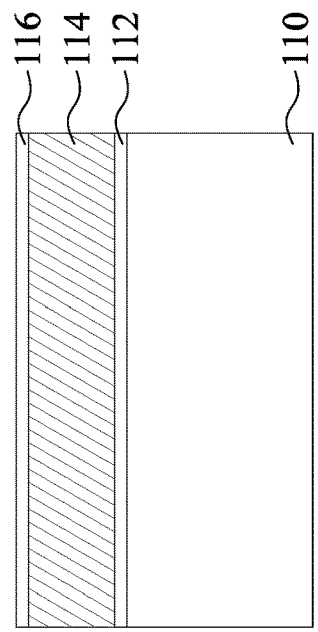
Figure 2A:
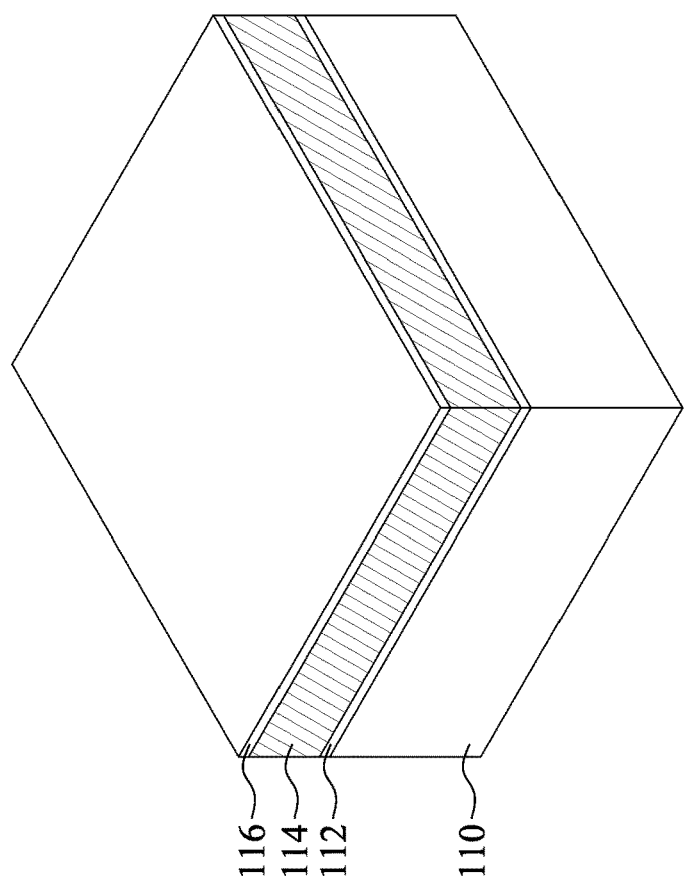

Referring to FIG. 1A and FIGS. 2A, 2B, the method begins at step S1 by receiving a substrate 110 and sequentially depositing a first hard mask layer 112, a second hard mask layer 114, and a third hard mask layer 116 over the substrate 110. In some embodiments, the first hard mask layer 112 and the third hard mask layer 116 are made by the same material which is different from the material of the second hard mask layer 114. In some embodiments, the second hard mask layer 114 may be made of polysilicon, and the first hard mask layer 112 and the third hard mask layer 116 are made of oxide.

In some embodiments, the substrate 110 is a semiconductor substrate and includes silicon. Alternatively, the substrate 110 includes germanium, silicon germanium or other proper semiconductor materials such as III/V materials. In another embodiment, the substrate 110 may include a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

Figure 3B:
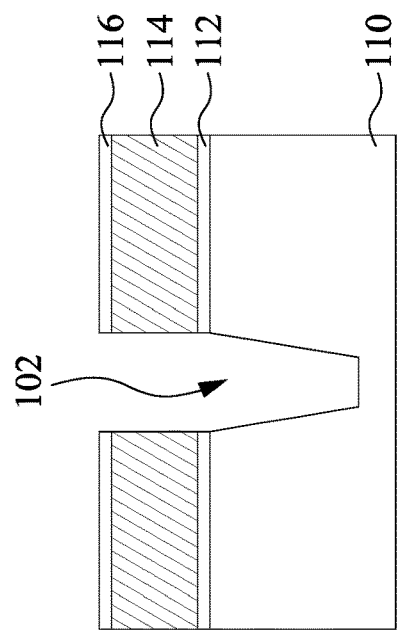
Figure 3A:
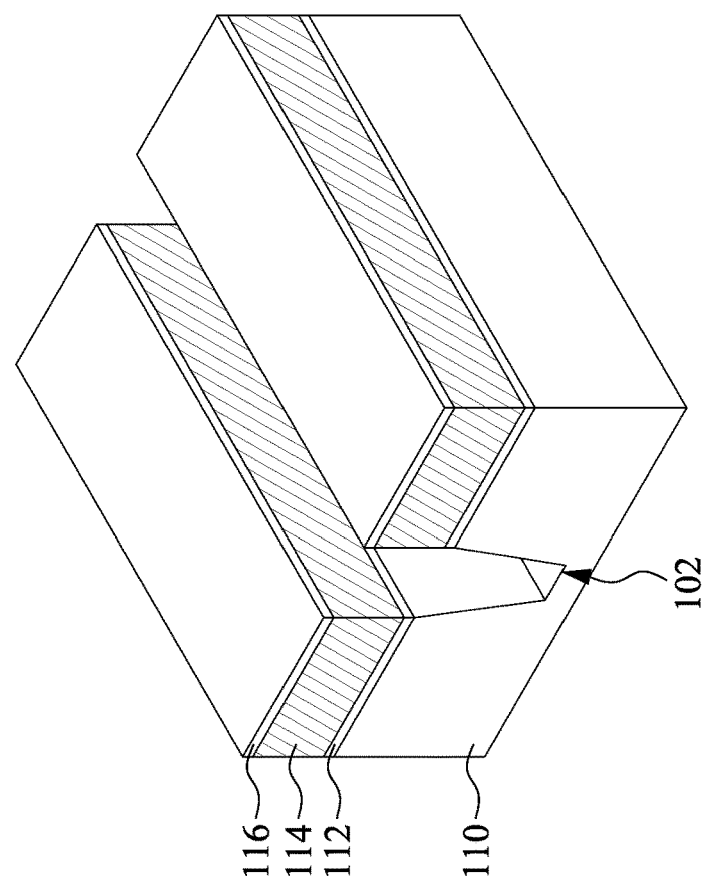
Figure 5B:
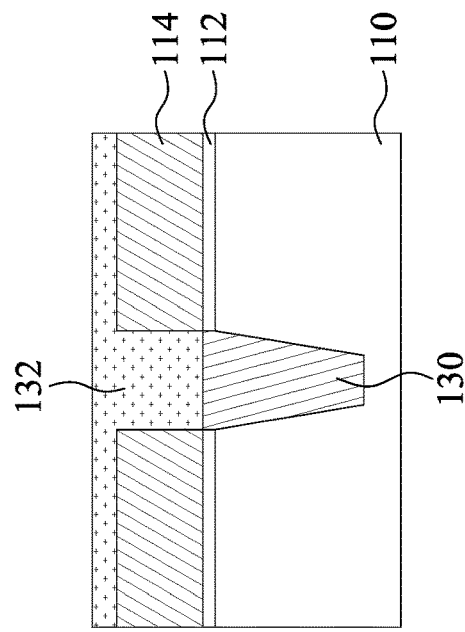
Figure 5A:
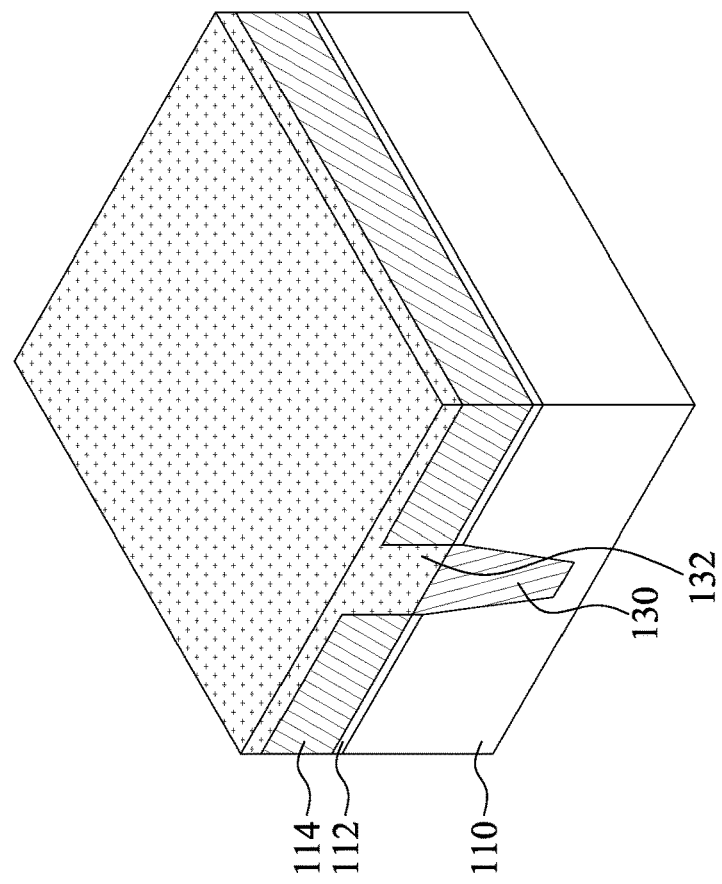
Figure 6B:
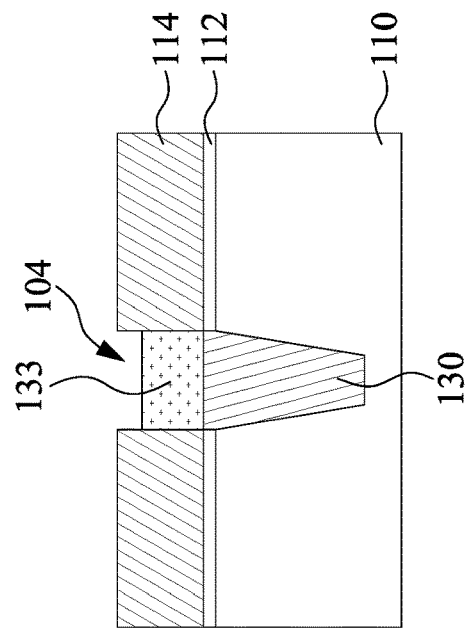
Figure 6A:
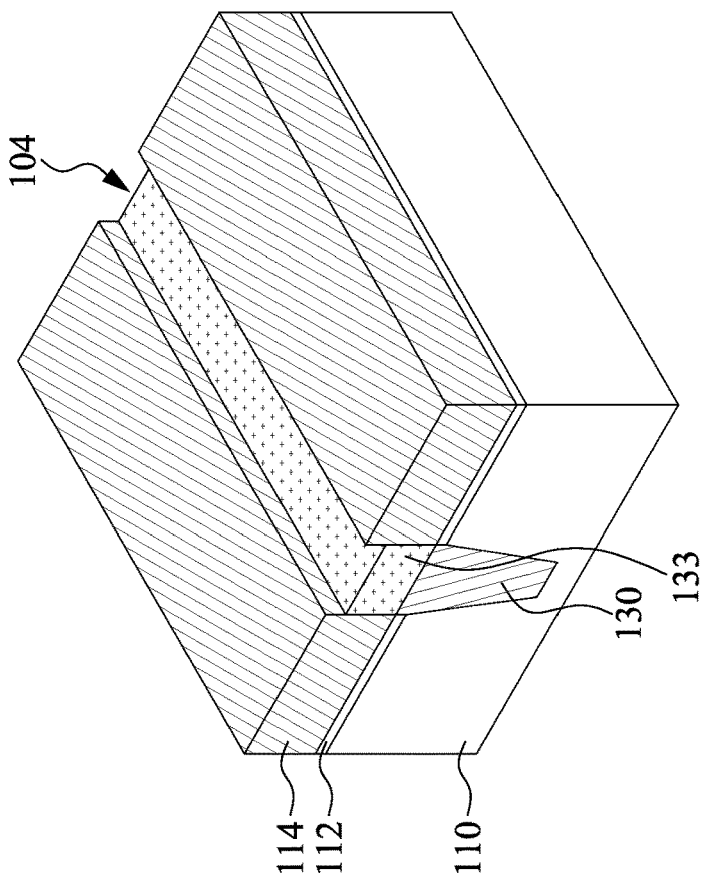

Referring to FIG. 1A and FIGS. 3A and 3B, the method proceeds to step S2 by forming a trench 102 in the substrate 110. The step S2 also includes a lithography process to form a photo resist pattern, and one or more etching processes and cleaning processes to remove a portion of each of the third hard mask layer 116, the second hard mask layer 114, the first hard mask layer 112, and the substrate 110 to form the trench 102.

Referring to FIG. 1A and FIGS. 4A and 4B, the method proceeds to step S3 by forming a first insulating layer 130 in the trench 102. In some embodiments, the first insulating layer 130 may be made of oxide. Thereafter, the third hard mask layer 116 was removed while the top portion of the first insulating layer 130 in the trench 102 was removed through an etch-back process such as a HF dip. After the etch-back process, the trench 102 is filled by the remained first insulating layer 130 while a gap 104 surrounded by the second hard mask layers 114 is formed above the first insulating layer 130. In some embodiments, when the first hard mask layer 112 and the third hard mask layer 116 are made of oxide, and the second hard mask layer 114 is made of polysilicon, the etching selectivity between the third hard mask layer 116 (e.g. oxide layer) and the second hard mask layer 114 (e.g. polysilicon layer) may protect the underlying first hard mask layer 112 and the substrate 110 from being etched.

Referring to FIG. 1A and FIGS. 4A, 4B, 5A and 5B, the method continues to step S4 by filling a first spacer layer 132 in the gap 104 above the first insulating layer 130 in the trench 102. The first spacer layer 132 is further deposited above the second hard mask layer 114. In some embodiments, the first spacer layer 132 may be made of silicon nitride.

Referring to FIG. 1A and FIGS. 5A, 5B, 6A and 6B, the method proceeds to step S5 by forming the first spacer 133. The first spacer 133 is formed by removing the portions of the first spacer layer 132 overlying the second hard mask layer 114 and removing the top portion of the first spacer layer 132 in the gap 104 through an etch-back process such as a $H_3PO_4$ dip. During the etch-back process, when the first hard mask layer 112 and the third hard mask layer 116 are made of oxide, and the second hard mask layer 114 is made of polysilicon, the etching selectivity between the second hard mask layer 114 (e.g. polysilicon layer) and the first spacer layer 132 (e.g. silicon nitride) may protect the underlying first hard mask layer 112 and the substrate 110 from being etched.

Figure 7B:
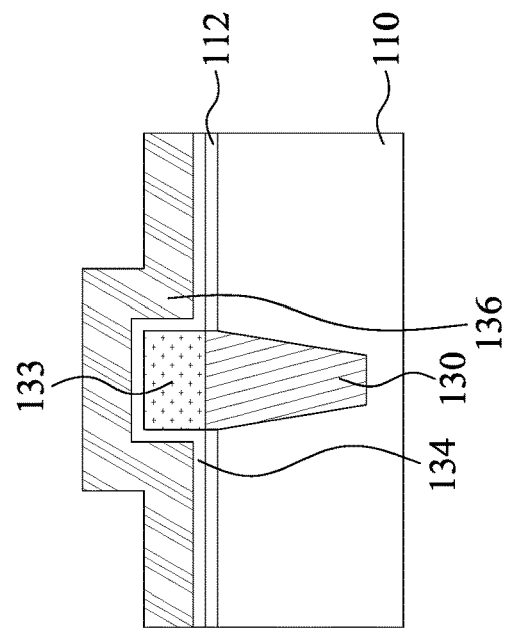
Figure 7A:
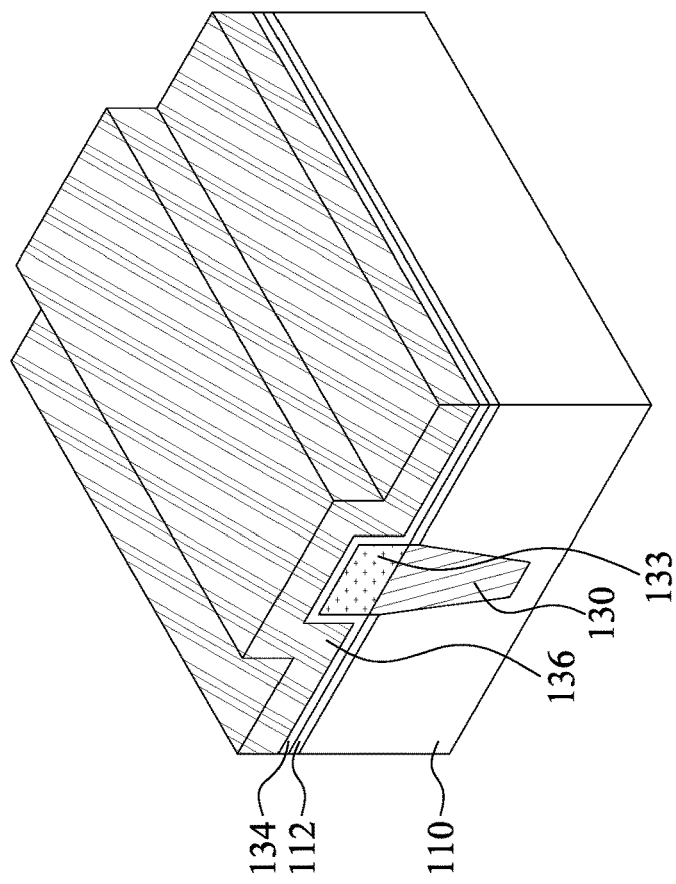

Referring to FIG. 1A and FIGS. 7A and 7B, the second hard mask layer 114 is removed after the first spacer 133 is formed. The method proceeds to step S6 by sequentially forming a second insulating layer 134 and a second spacer layer 136. The second insulating layer 134 is conformally deposited to cover a top surface and two sidewalls of the first spacer 133. The second spacer layer 136 is conformally deposited to cover a top surface and two sidewalls of the second insulating layer 134. In some embodiments, the second insulating layer 134 may be made of oxide, and the second spacer layer 136 may be made of silicon nitride.

Figure 8B:
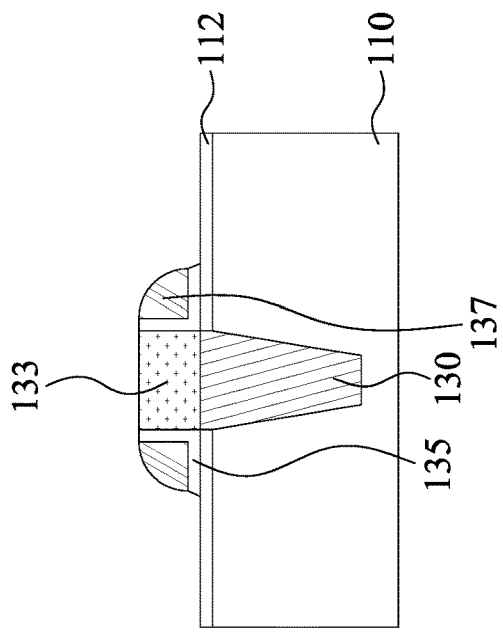
Figure 8A:
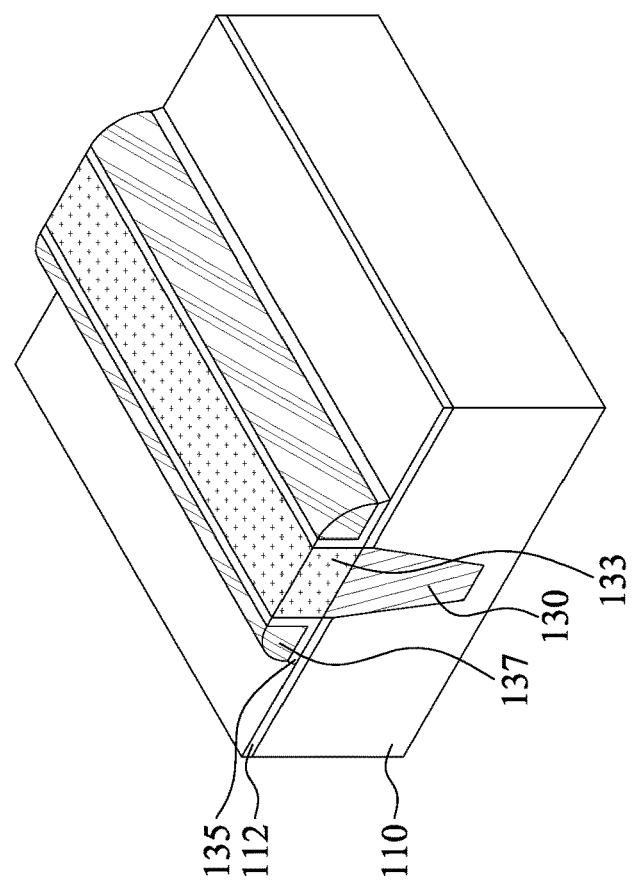

Referring to FIG. 1A and FIGS. 7A, 7B, 8A and 8B, the method proceeds to step S7 by forming second spacers 137. The second spacers 137 are formed by removing the portions of the second spacer layer 136 overlying the second insulating layer 134 by selective etching. The second insulating layer 134 overlying the first spacer 133 may acts as a sacrificial layer to avoid the first spacer 133 being etched. In some embodiments, as shown in FIGS. 8A and 8B, a portion of the second insulating layer 134 overlying the first spacer 133 is etched, and portions of the second insulating layer 134 between the second spacer layer 136 and the first hard mask layer 112 are also etched. In some other embodiments, the portion of the second insulating layer 134 overlying the first spacer 133, and the portions of the second insulating layer 134 between the second spacer layer 136 and the first hard mask layer 122 may be remained and are further removed through another etching process. After the etching process, two second spacers 137 are formed, and two second insulating structures 135 located on the sidewalls of the first spacer 133 and between the second spacers 137 and the firsts hard mask layer 112 are remained. In other words, two second spacers 137 are adjacent to the second insulating structures 135. Thereafter, the first spacer 133, the two second spacer 137, and the two second insulating structures 135 may collectively act as a mask for patterning the first hard mask layer 112 and the substrate 110 in the following steps.

Referring to FIG. 1A and FIGS. 9A and 9B, the method proceeds to step S8 by forming recesses 106 of shallow trench isolation (STI) structures. In some embodiments, the recesses 106 are formed by removing the first hard mask layer 112 exposed by the first spacer 113, the second spacers 137, and the second insulating structures 135 by etching process. In some embodiments, when the second insulating layer 134 is not completely etched in step S7, the recesses 106 are formed by removing the first hard mask layer 112 and the remaining second insulating layer 134 exposed by the first spacer 113, the second spacers 137, and the second insulating structures 135 by etching process. After the first hard mask layer 112 and/or the second insulating layer 134 are removed, the portions of the substrate 110 that are not covered by the first spacer 113, the second spacer 137, and the second insulating structures 135 are removed by the etching process to form the recesses 106.

As shown in FIGS. 9A and 9B, after the substrate 110 is etched, the upper portion of the remained substrate 110 may referred to as a fin structure 120. The fin structure 120 includes a first portion 122A and a second portion 122B, and the first insulating layer 130 is disposed between the first portion 122A and the second portion 122B. In some embodiments, when the first hard mask layer 112 and the first insulating layer 130 are made of the same material (e.g. oxide), the remained portion of the first hard mask layer 112 underlying the second insulating structure 135 and the second spacers 137 may be referred to as part of the first insulating layer 130.

Referring to FIG. 1B and FIGS. 10A and 10B, the method proceeds to step S9 by forming shallow isolation trench (STI) structures 170. The STI structures 170 are formed by depositing an oxide layer to cover the recesses 106, the first spacer 133, the second spacers 137, and the second insulating structures 135. After the oxide layer is deposited, the oxide layer is planarized such that a top surface of the oxide layer may be substantially level with the top surface of the first spacer 133. In some embodiments, the planarization may be performed by a CMP process. Thereafter, the oxide layer is further removed by etch-back process such as a HP dip to form the STI structures 170. In some embodiments, the second insulating structures 135 and the first hard mask layer 112 that are made of oxide may also be partially etched during the etch-back process.

Figure 11B:
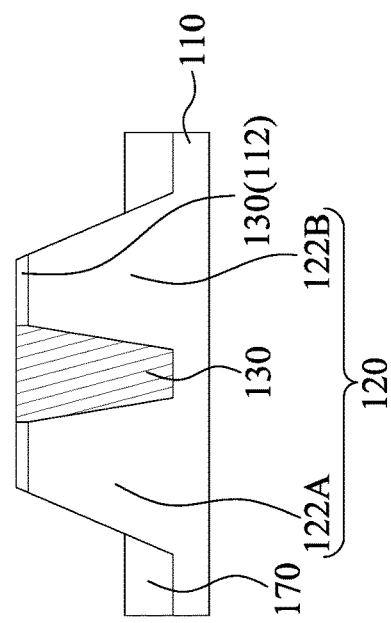
Figure 11A:
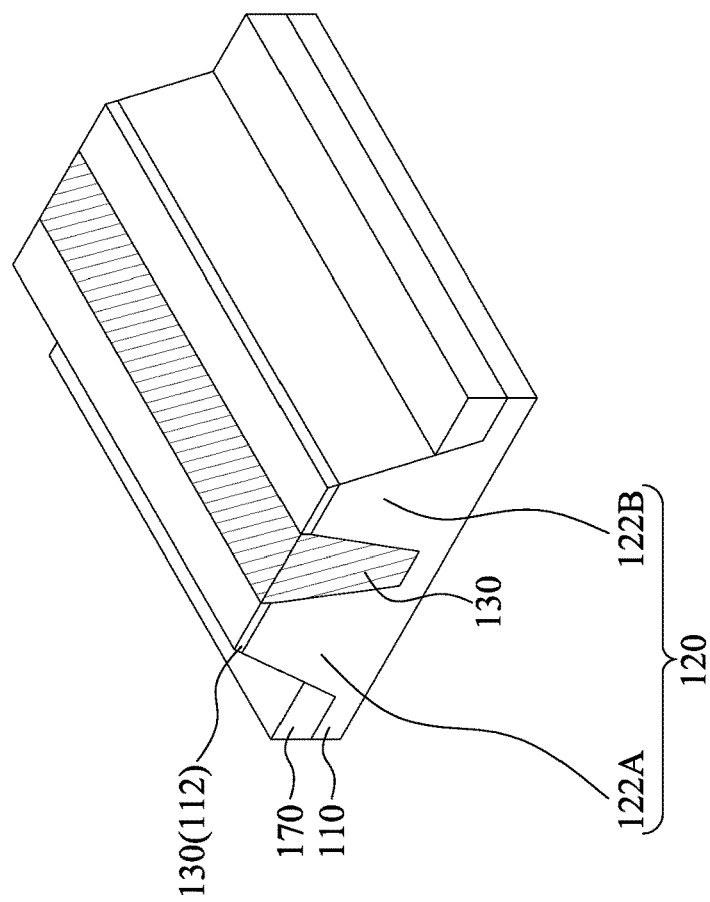
Figure 12A:
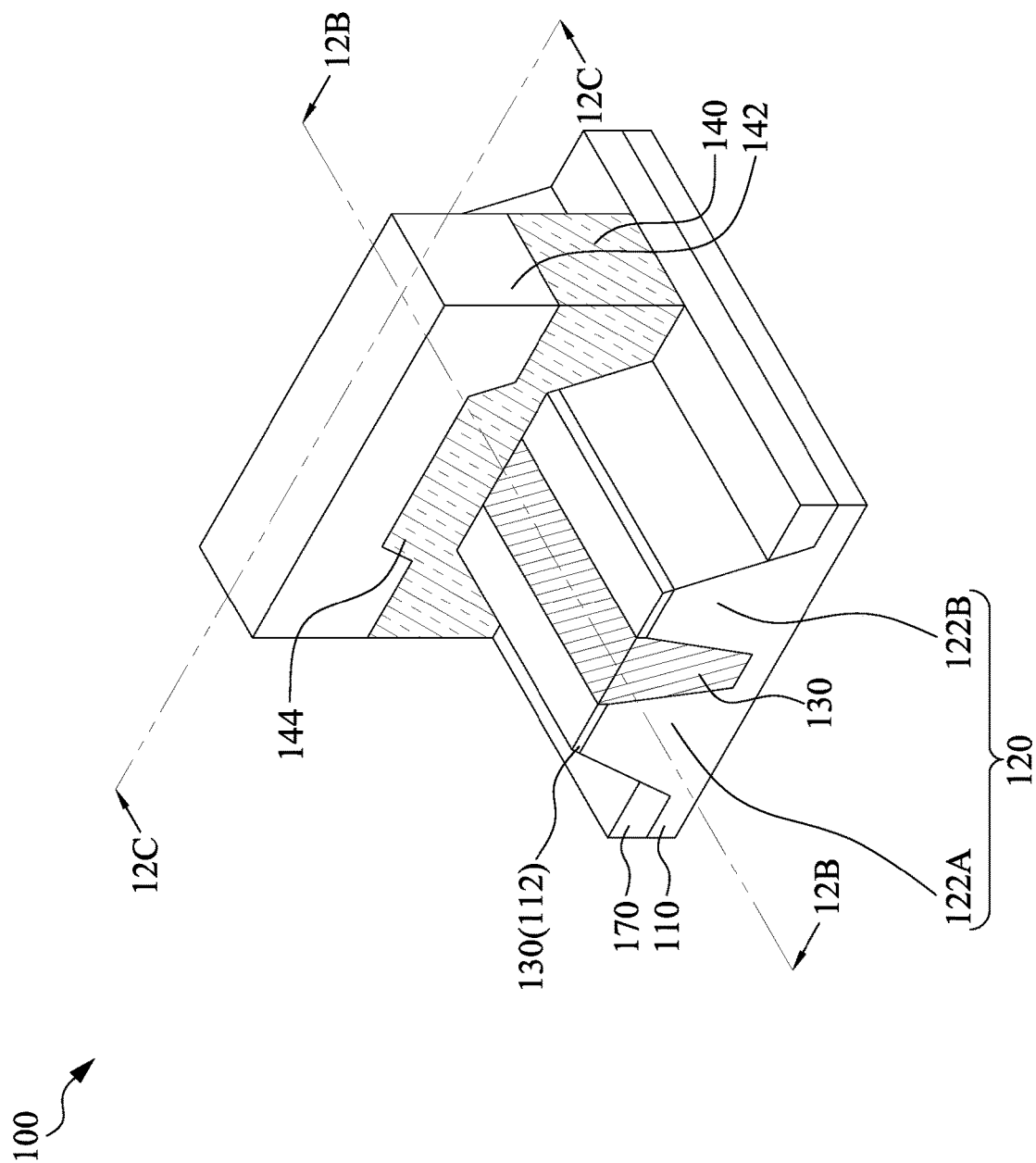
FIGS. 12A, 13A, 14A, 15, 16A are perspective views of a memory device at different intermediate fabrication stage of the method of FIGS. 1A and 1B according to some embodiments of the present disclosure.
Figure 12C:
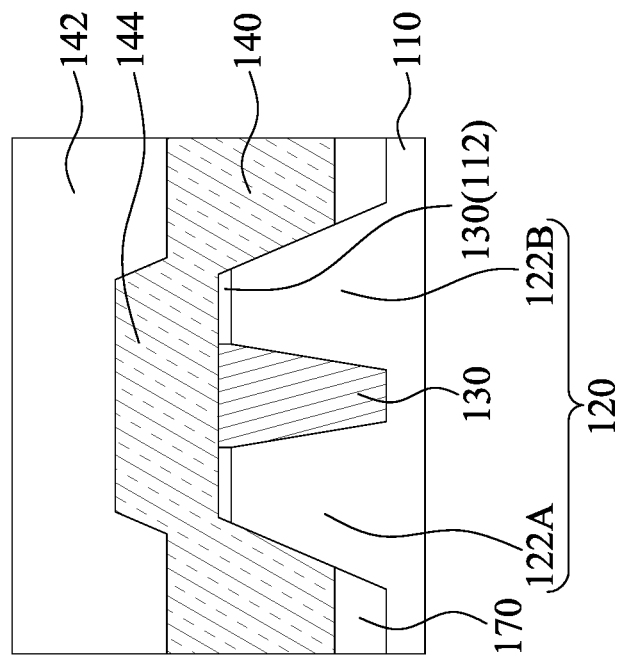
Figure 12B:
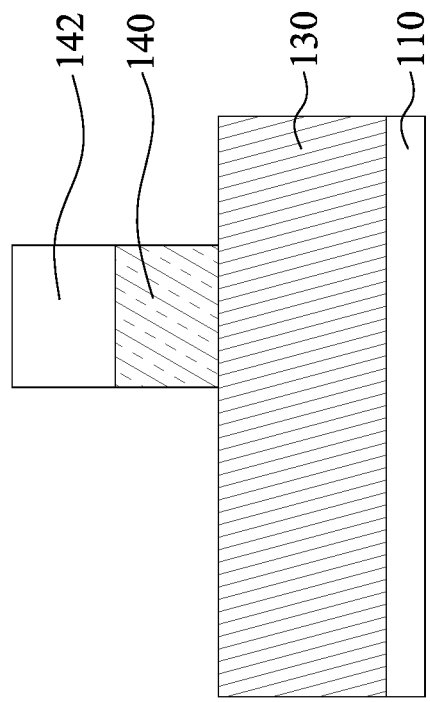

Referring to FIG. 1B and FIGS. 10A, 10B, 11A and 11B, the method proceeds to Step S10 by removing the first spacer 133, the second spacers 137, and the second insulating structures 135. The first spacer 133 and the second spacers 137 are removed by etch-back process such as a HP dip. In some embodiments, the second insulating structures 135 are removed at the same process by $H_3PO_4$ dip. As shown in FIGS. 11A and 11B, an upper portion of the first insulating layer 130 (including the remaining portions of the first hard mask layer 112) covers top surfaces of the first portion 122A and the second portion 122B. In some other embodiments, a planarization process may be further performed on the first insulating layer 130 such that the top surface of the first insulating layer 130 is substantially level with the top surfaces of the first portion 122A and the second portion 122B of the fin structure 120. In other words, the remaining portions of the first hard mask layer 112 and an upper portion of the first insulating layer 130 may be removed.

FIGS. 12A, 13A, 14A, 15, 16A are perspective views of the memory device 100 at different intermediate fabrication stage of the method of FIG. 1B according to some embodiments of the present disclosure. FIGS. 12B, 12C, 13B, 13C, 14B, 14C, 14D, 16B, 16C, and 16D are cross sectional views of the memory device 100 taken along the line 12B-12B, line 12C-12C, line 13B-13B, line 13C-13C, line 14B-14B, line 14C-14C, line 14D-14D, line 16B-16B, line 16C-16C, and line 16D-16D in FIGS. 12A, 13A, 14A, and 16A according to some embodiments of the present disclosure.

Referring to FIG. 1B and FIGS. 12A, 12B, and 12C, the method proceeds to step S11 by forming a select gate 140. The select gate 140 is formed by depositing a select gate dielectric layer (not shown) over the substrate 110, the first insulating layer 130, the fin structure 120, and the STI structures 170. Thereafter, a select gate layer is deposited over the select gate dielectric layer, and a fourth hard mask 142 is formed above the select gate layer. The select gate dielectric layer and the select gate layer are patterned by using the fourth hard mask 142 as a mask to form the gate dielectric and the select gate 140. As a result, the select gate 140 includes a protruding portion 144 overlying the first insulating layer 130 and the fin structure 120.

Figure 13A:
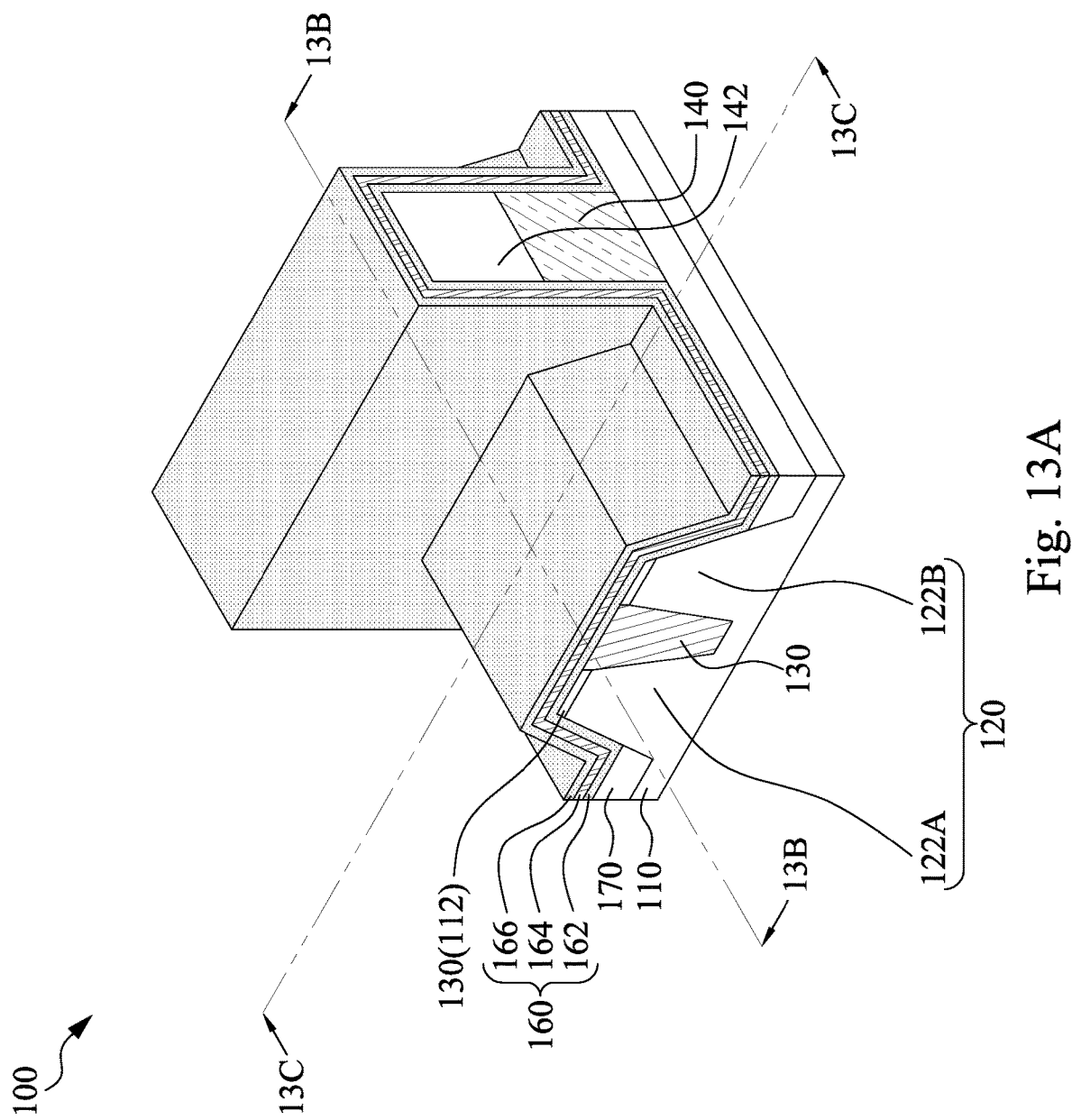

Referring to FIG. 1B and FIGS. 13A, 13B, and 13C, the method proceeds to step S12 by forming a charge trapping layer 160. Forming the charge trapping layer 160 includes depositing an oxide layer 162 (e.g., silicon oxide) over the select gate 140, the fourth hard mask layer 142, the first insulating layer 130, the fin structure 120, and the STI structures 170. Thereafter, depositing a nitride layer 164 (e.g., silicon nitride) over the oxide layer 162, and depositing another oxide layer 166 (e.g., silicon oxide) over the nitride layer 164. In some embodiments, the step S12 is also referred to as depositing an ONO (oxide-nitride-oxide) layer. As shown in FIGS. 13A and 13C, the portion of the charge trapping layer 160 away from the select gate 140 is conformal to a profile collectively defined by the first insulating layer 130, the fin structure 120, and the STI structures 170.

Figure 14A:
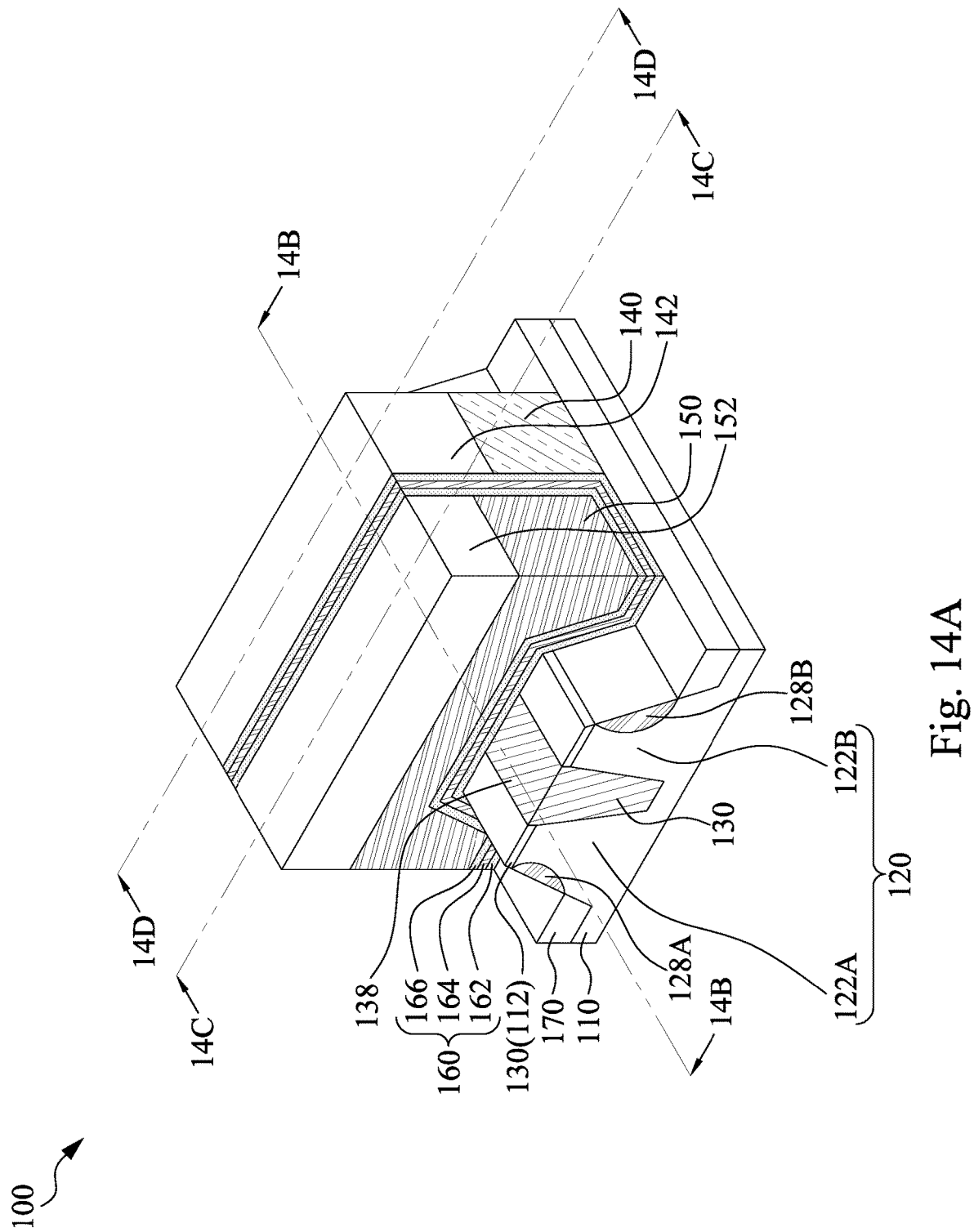

Referring to FIG. 1B and FIGS. 14A, 14B, 14C, and 14D, the method continues to step S13 by forming a memory gate 150. The memory gate 150 is formed by depositing a memory gate layer over the oxide layer 166. In some embodiments, as shown in 14B and 14C, a top surface of the memory gate layer is removed through an etching process. The step S12 also includes depositing a fifth hard mask 152 above the memory gate layer. The memory gate layer is patterned by using the fifth hard mask 152 as a mask to form the memory gate 150. As shown in FIG. 14B, the portions of the select gate 140 and the memory gate 150 overlying the first insulating layer 130 and the fin structure 120 are coplanar such that other subsequent processes may be performed easily. Thereafter, portions of the charge trapping layer 160 on top of the fourth hard mask layer 142, adjacent to a side of the select gate 140 away from the memory gate 150, and free from coverage of the memory gate 150 are removed. As a result, the remained charge trapping layer 160 is located between the memory gate 150 and the select gate 140, between the memory gate 150 and the first insulating layer 130, and between the memory gate 150 and the fin structure 120. The portion of the charge trapping layer 160 arranged between the memory gate 150 and the fin structure 120 can provide electrical isolation and data storage. The fifth hard mask 152 is or otherwise includes, for example, silicon nitride.

Still referring to FIG. 1B and FIGS. 14A, 14B, 14C, and 14D, the method proceeds to step S14 by forming a first source/drain region 128A in the first portion 122A and a second source/drain region 128B in the second portion 122B of the fin structure 120 through ion implantation. In other words, the first source/drain region 128A is electrically insulated from the second source/drain region 128B by the first insulating layer 130. In some embodiments, the step S14 may include a photo lithography process to define an ion implantation region. Further, the first source/drain region 128A and second source/drain region 128B may be made of similar and/or different materials than the substrate.

Figure 14D:
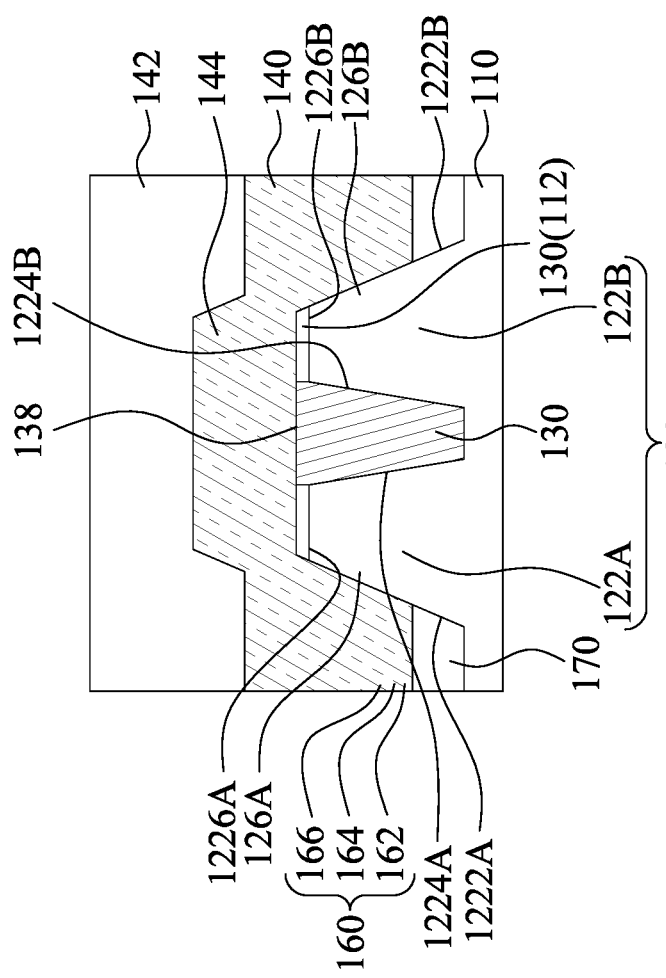

As shown in FIGS. 14C and 14D, the first portion 122A and the second portion 122B respectively includes a first channel region 126A and a second channel region 126B covered by the select gate 140 and the memory gate 150. The first portion 122A covered by the select gate 140 and the memory gate 150 serves as the first channel region 126A, and the second portion 122B covered by the select gate 140 and the memory gate 150 serves as the second channel region 126b. The first insulating layer 130 is disposed between the first channel region 126A of the first portion 122A and the second channel region 126B of the second portion 122B. In other words, the first channel region 126A is electrically insulated from the second channel region 126B by the first insulating layer 130.

As shown in FIG. 14C or 14D, the first portion 122A of the fin structure 120 includes a first sidewall 1222A and a second sidewall 1224A, and the second portion 122B of the fin structure 120 includes a first sidewall 1222B and a second sidewall 1224B. The second sidewall 1224A of the first portion 122A and the second sidewall 1224B of the second portion 122B are between the first sidewall 1222A of the first portion 122A and the first sidewall 1222B of the second portion 122B. A first side of the first channel region 126A corresponding to the first sidewall 1222A and a first side of the second channel region 126B corresponding to the first sidewall 1222B are not covered by the first insulating layer 130, but are directly in contact with the charge trapping layer 160. A second side of first channel region 126A corresponding to the second sidewall 1224A and a second side of the second channel region 126B corresponds to the second sidewall 1224B are separated from the charge trapping layer 160 by the first insulating layer 130. In other words, the charge trapping layer 160 and the select gate 140 are located at the first sides of the first channel region 126A and the second channel region 126B, and the first insulating layer 130 is located at the second sides of the first channel region 126A and the second channel region 126B.

As shown in FIG. 14A, 14C, or 14D, the first insulating layer 130 is disposed between the second sidewall 1224A of the first portion 122A and the second sidewall 1224B of the second portion 122B. In some embodiments, a top surface 138 of the first insulating layer 130 is substantially level with the top surface 1226A of the first portion 122A and the top surface 1226B of the second portion 122B. In some other embodiments, an upper portion of the first insulating layer 130 may cover the top surface 1226A of the first portion 122A and the top surface 1226B of the second portion 122B. A bottom surface of the first insulating layer 130 is lower than a top surface of the STI structure 170, and portions of the charge trapping layer 160 are overlying the STI structures.

As shown in FIG. 14A, the select gate 140 and the memory gate 150 extend across the fin structure 120 and the first insulating layer 130. As shown in FIG. 14D, the select gate 140 includes a protruding portion 144 overlying the first insulating layer 130 and the fin structure 120. As shown in FIG. 14B, a topmost surface 146 of the select gate 140 is substantially level with a topmost surface 154 of the memory gate 150. In other words, as shown in FIG. 14A, top surfaces of the portions of the select gate 140 overlying the STI structures 170 are lower than top surfaces of the portions of the memory gate 150 overlying the STI structures 170.

As shown in FIGS. 14A, 14B, and 14C, the charge trapping layer 160 is disposed between the memory gate 150 and the select gate 140, between the memory gate 150 and the first insulating layer 130, between the memory gate 150 and the fin structure 120, and between the memory gate 150 and the STI structures 170. Specifically, as shown in FIGS. 14A and 14C, portions of the charge trapping layer 160 are respectively disposed between the first sidewall 1222A of the first portion 122A and the memory gate 150, and between the first sidewall 1222B of the second portion 122B and the memory gate 150. As shown in FIG. 14C, the second sidewall 1224B of the first portion 122A and the second sidewall 1224B of the second portion 122B are separated from the charge trapping layer 160 by the first insulating layer 130. In other words, the second sidewall 1224A of the first portion 122A and the second sidewall 1224B of the second portion 122B are free from in contact with the charge trapping layer 160.

In some embodiment, as shown in FIGS. 14A and 14C, the portion of the charge trapping layer 160 underlying the memory gate 150 includes a first segment and two second segments. The first segment is in contact with the top surface 138 of the first insulating layer 130. The second segments collectively cover the first sidewall 1222A, 1222B with the STI structures 170. The first segment connects with the two second segments. In some embodiments, when the top surface 138 of the first insulating layer 130 is substantially level with the top surface 1226A of the first portion 122A and the top surface 1226B of the second portion 122B, the first segment of the charge trapping layer 160 is in contact with both the top surface 138 of the first insulating layer 130, the top surface 1226A of the first portion 122A, and the top surface 1226B the second portion 122B.

Figure 15:
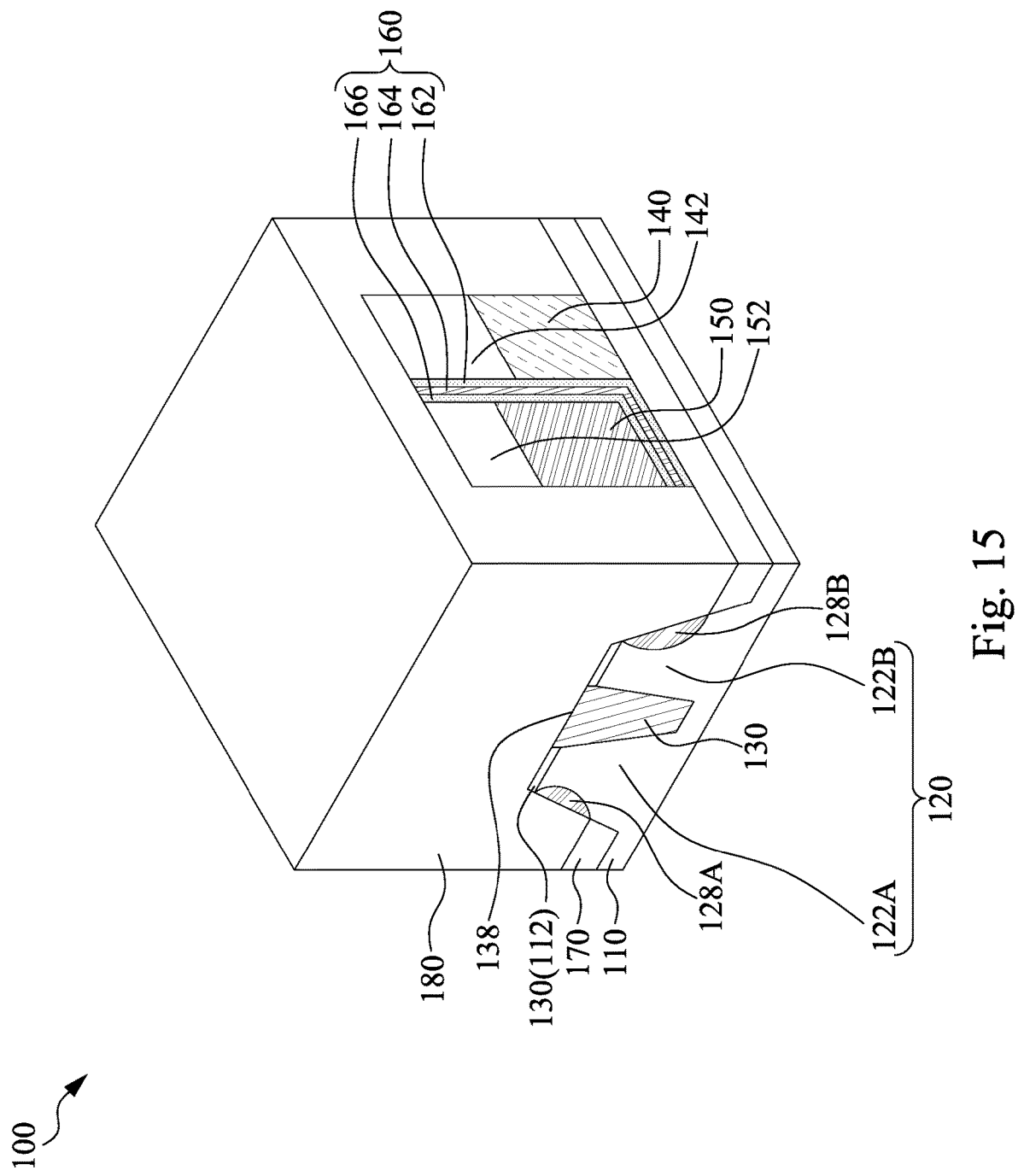

Referring to FIG. 1B and FIG. 15, the method proceeds to step S15 by forming an inter-layer dielectric (ILD) layer 180 over the substrate 110 and the STI structures 170, and surrounding the fin structure 120, the first insulating layer 130, the select gate 140, the memory gate 150, and the charge trapping layer 160.

Figure 16A:
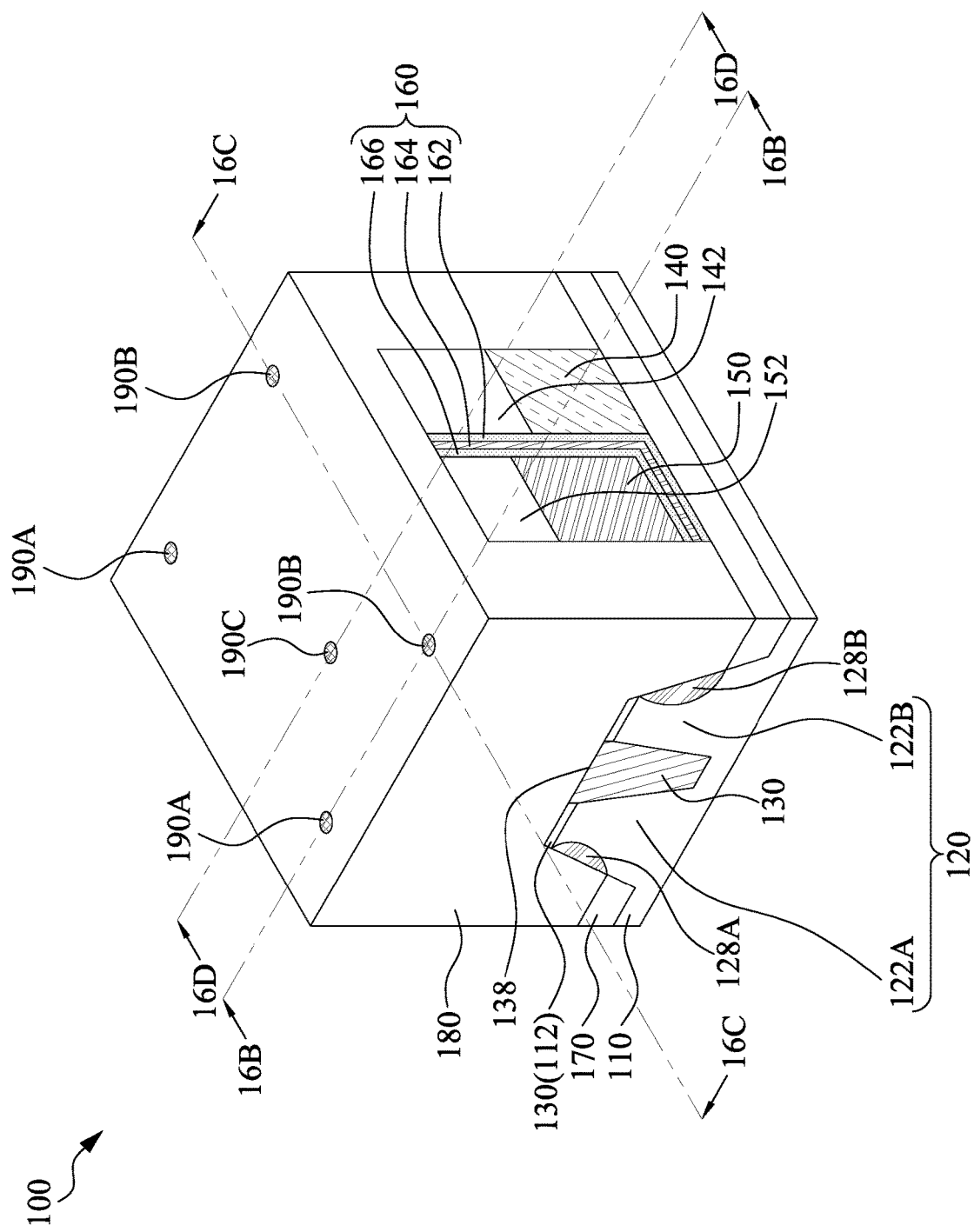
Figure 16C:
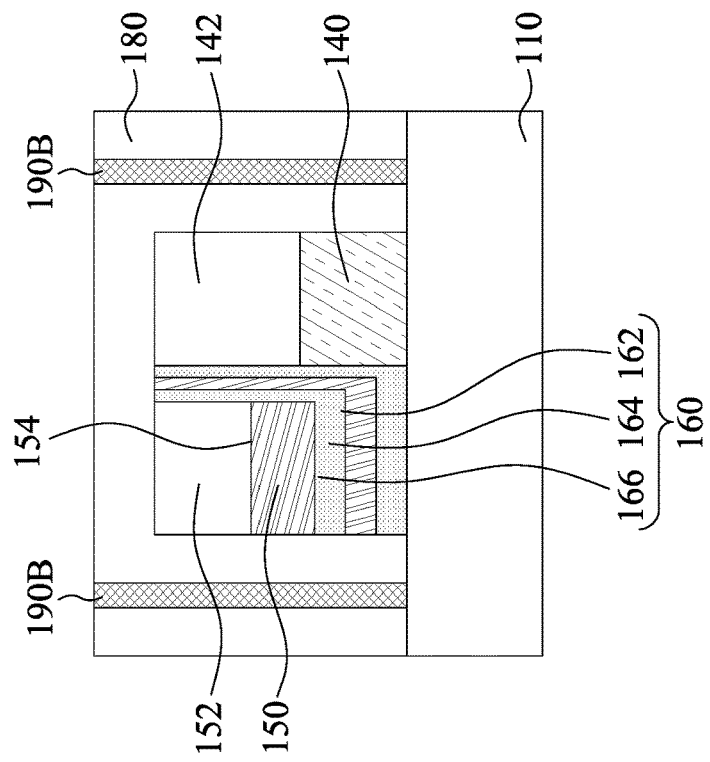
Figure 16B:
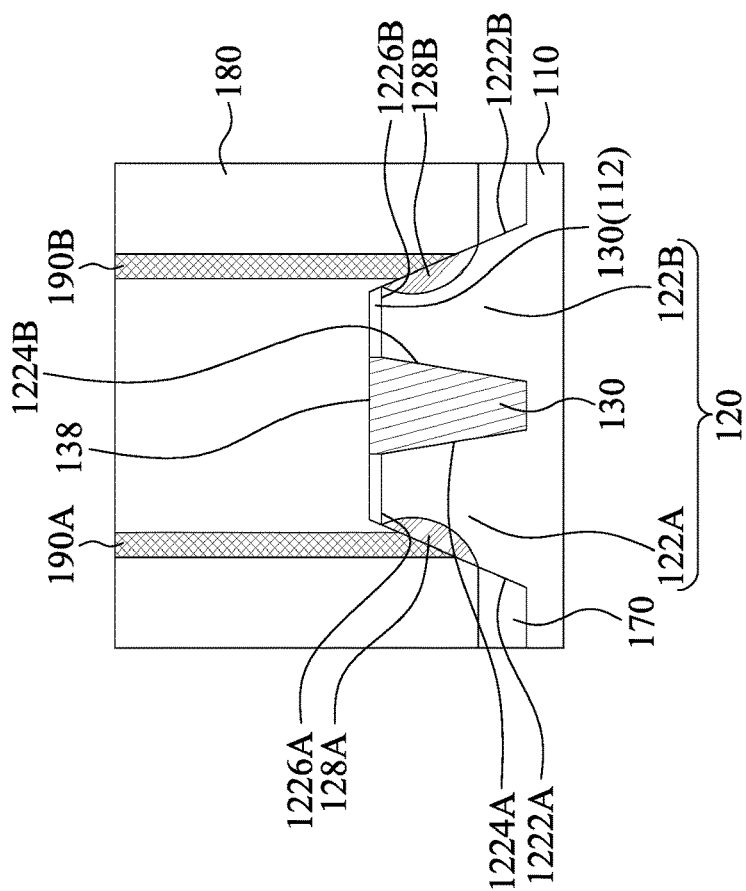
Figure 16D:
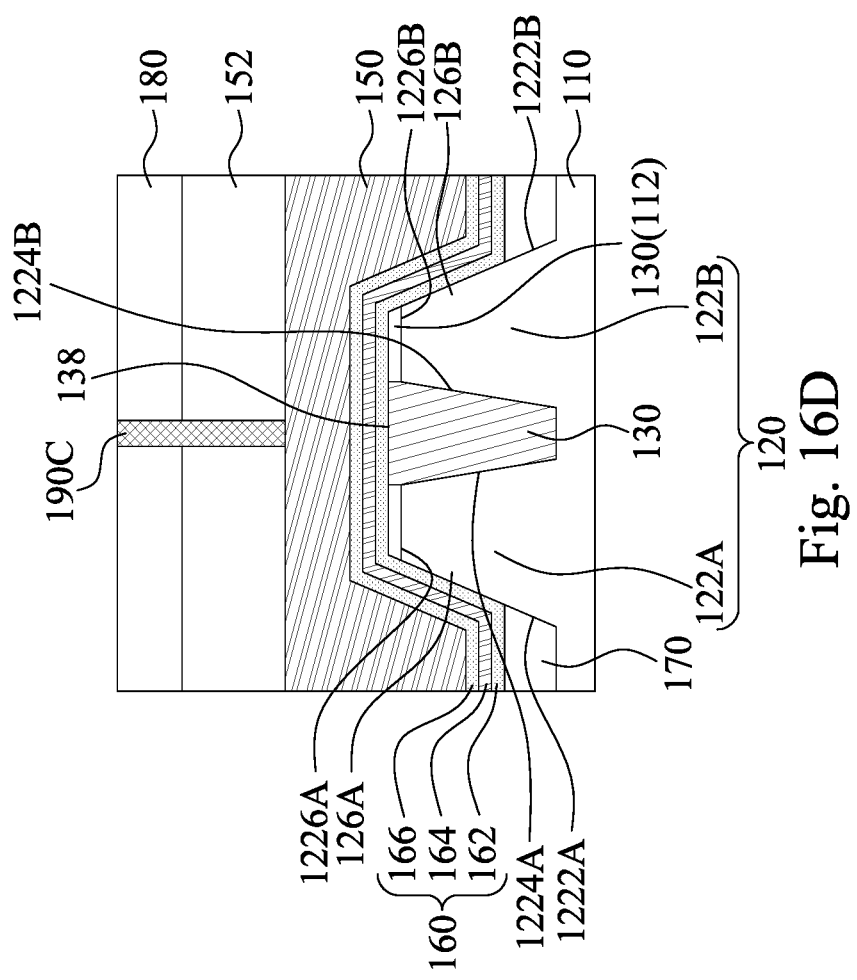

Referring to FIG. 1B and FIGS. 16A, 16B, 16C, and 16D, and the method proceeds to step S16 by forming conductive contacts 190A, 190B, 190C extending through the ILD layer 180. As shown in FIGS. 16B and 16C, conductive contacts 190A are connected with the first source/drain region 128A, and the conductive contacts 190B are connected with the second source/drain region 128B. As shown in FIG. 16D, conductive contact 190C is connected with the memory gate 150. The conductive contacts 190A, 190B, 190C are or otherwise include, for example, a metal such as tungsten, copper, aluminum, gold, or silver, or polysilicon.

As described above, the present disclosure provides a MONOS memory device includes two channel regions within single fin structure. The first and second channel regions and the first and second source/drain regions can be insulated from each other by the first insulating layer. In other words, the first sidewalls of the first portion and the second portion of the fin structure are in contact with the charge trapping layer, while the second sidewalls of the first portion and the second portion of the fin structure are insulated from the charge trapping layer by the first insulating layer. Accordingly, double channel MONOS memory device can provide higher memory-density, for example, two times higher than conventional MONOS memory device.

According to some embodiments of the present disclosure, a semiconductor device includes a substrate, a fin structure, an insulating layer, a select gate, a memory gate, and a charge trapping layer. The fin structure includes a first portion and a second extend from the substrate. Each of the first portion and the second portion includes a first sidewall and a second sidewall, and the second sidewalls are between the first sidewalls. The insulating layer is disposed between the second sidewalls of the first and second portions. The select gate and the memory gate extend across the fin structure and the insulating layer. The charge trapping layer is disposed between the memory gate and the select gate, between the memory gate and the insulating layer, and between the memory gate and the fin structure, and the second sidewalls of the first and second portions are free from in contact with the charge trapping layer.

According to some embodiments of the present disclosure, a semiconductor device includes a substrate, a fin structure, an insulating layer, a select gate, a memory gate, and a charge trapping layer. The fin structure includes a first and second portions extending from the substrate. The select gate and the memory gate extend across the fin structure and the insulating layer. The first portion and the second portion each includes a channel region covered by the select gate and the memory gate. The insulating layer is disposed between the channel regions, and a first side of each of the channel regions is free from being covered by the insulating layer. The charge trapping layer is disposed between the memory gate and the select gate, between the memory gate and the insulating layer, and between the memory gate and the fin structure, and the first side of each of the channel regions is directly in contact with the charge trapping layer.

According to some embodiments of the present disclosure, a method of forming a semiconductor device includes forming a first insulating layer over a top surface of a substrate and fill a trench in the substrate; forming a first spacer overlying a portion of the first insulating layer covering the trench; forming a second insulating structure on a sidewall of the first spacer; forming a second spacer adjacent to the second insulating structure and overlying the first insulating layer such that the second insulating structure is spaced between the first and second spacer; forming a fin structure by patterning the first insulating layer and the substrate by using the first spacer, the second insulating structure, and the second spacer as a hard mask; removing the first spacer, the second spacer, and the second insulating structure; and forming gate stacks across the first insulating layer and the fin structure, wherein the gate stacks comprising a select gate, a memory gate, and a charge trapping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a fin structure comprising a first portion and a second portion extending from the substrate, wherein the first portion and the second portion each comprises a first sidewall and a second sidewall, and the second side- walls of the first and second portions are between the first sidewalls of the first and second portions;

an insulating layer disposed between the second sidewalls of the first and second portions;

a select gate and a memory gate extending across the fin structure and the insulating layer; and a charge trapping layer disposed between the memory gate and the select gate, between the memory gate and the insulating layer, and between the memory gate and the fin structure, wherein the second sidewalls of the first and second portions directly below the memory gate are free from direct physical contact with the charge trapping layer.

2. The semiconductor device of claim 1, wherein a top surface of the insulating layer is substantially level with top surfaces of the first and second portions.

3. The semiconductor device of claim 1, wherein the first portion and the second portion each comprises a channel region covered by the memory gate and the select gate, and the insulating layer is disposed between the channel regions of the first and second portions.

4. The semiconductor device of claim 1, further comprising:

a shallow trench isolation (STI) structure disposed above the substrate, wherein a bottom surface of the insulating layer is lower than a top surface of the STI structure.

5. The semiconductor device of claim 1, wherein the select gate comprises a protruding portion overlying the insulating layer and the fin structure.

6. The semiconductor device of claim 1, further comprising:

an inter-layer dielectric (ILD) structure disposed over and surrounding the select gate, the memory gate, and the charge trapping layer; and a conductive contact extending through the ILD structure to the first sidewall of the first portion of the fin structure or the first sidewall of the second portion of the fin structure.

7. The semiconductor device of claim 1, wherein the second sidewalls of the first and second portions are separated from the charge trapping layer by the insulating layer.

8. A semiconductor device, comprising:

a substrate;

a fin structure comprising first and second portions extending from the substrate;

a shallow trench isolation structure laterally surrounding the fin structure;

a select gate and a memory gate extending across the fin structure, wherein the first portion and the second portion each comprise a channel region covered by the select gate and the memory gate;

an insulating layer disposed between the channel regions, wherein a first side of each of the channel regions is free from being covered by the insulating layer; and a charge trapping layer disposed between the memory gate and the select gate, between the memory gate and the insulating layer, and between the memory gate and the fin structure, wherein the first side of each of the channel regions is directly in contact with the charge trapping layer, and an interface between the insulating layer and the charge trapping layer is higher than a top surface of the shallow trench isolation structure.

9. The semiconductor device of claim 8, wherein the charge trapping layer and the select gate are located at the first side of each of the channel regions, and the insulating layer is located at a second side opposite to the first side of each of the channel regions.

10. The semiconductor device of claim 8, wherein an upper portion of the insulating layer covers top surfaces of the channel regions.

11. The semiconductor device of claim 8, further comprises:

an inter-layer dielectric (ILD) structure disposed over and surrounding the select gate, the memory gate, and the charge trapping layer; and a conductive contact extending through the ILD structure to a first sidewall of the first portion of the fin structure or a first sidewall of the second portion of the fin structure.

12. The semiconductor device of claim 8, wherein a topmost surface of the select gate is substantially level with a topmost surface of the memory gate.

13. The semiconductor device of claim 8, wherein a second side of each of the channel regions opposite to the first side is separated from the charge trapping layer by the insulating layer.

* * * * *